(12) United States Patent
Coutts et al.

(10) Patent No.: US 9,618,957 B2
(45) Date of Patent: Apr. 11, 2017

(54) SWITCHABLE PACKAGE CAPACITOR FOR CHARGE CONSERVATION AND SERIES RESISTANCE

(71) Applicant: QUALCOMM Incorporated, San Diego, CA (US)

(72) Inventors: Ryan Michael Coutts, Carlsbad, CA (US); Mikhail Popovich, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/164,130

(22) Filed: May 25, 2016

(65) Prior Publication Data

US 2016/0266596 A1  Sep. 15, 2016

Related U.S. Application Data

(62) Division of application No. 14/250,150, filed on Apr. 10, 2014, now Pat. No. 9,377,804.

(51) Int. Cl.

| | |
|---|---|
| *H01L 23/02* | (2006.01) |
| *G05F 3/02* | (2006.01) |
| *G05F 1/00* | (2006.01) |
| *H01L 23/50* | (2006.01) |
| *H01L 23/64* | (2006.01) |

(Continued)

(52) U.S. Cl.
CPC .............. *G05F 3/02* (2013.01); *G05F 1/00* (2013.01); *G06F 1/3287* (2013.01); *H01L 23/50* (2013.01); *H01L 23/62* (2013.01); *H01L 23/647* (2013.01); *H01L 24/16* (2013.01); *H01L 28/40* (2013.01); *H01L 23/49816* (2013.01); *H01L 23/49822* (2013.01); *H01L 23/49827* (2013.01); *H01L 2224/16227* (2013.01); *H01L 2924/15311* (2013.01); *Y02B 60/1282* (2013.01)

(58) Field of Classification Search
CPC . H01L 28/40; H01L 27/0676; H01L 27/0716; H01L 27/0755; H01L 27/0777; H01L 27/0788; H01L 27/0794; H01L 27/0805; H01L 27/0682; H01L 27/101; H01L 27/0658; H01L 27/0722; H01L 27/0727; H01L 27/0738
USPC ......................................... 257/532, 533, 678
See application file for complete search history.

(56) References Cited

U.S. PATENT DOCUMENTS

| | | |
|---|---|---|
| 6,072,690 A | 6/2000 | Farooq et al. |
| 6,700,390 B2 | 3/2004 | Gauthier et al. |

(Continued)

FOREIGN PATENT DOCUMENTS

| | | |
|---|---|---|
| JP | 2012190862 A | 10/2012 |
| WO | WO-2012014014 A2 | 2/2012 |

OTHER PUBLICATIONS

International Search Report and Written Opinion—PCT/US2015/019526—ISA/EPO—Nov. 6, 2015.

(Continued)

*Primary Examiner* — Sonya D McCall Shepard
(74) *Attorney, Agent, or Firm* — Loza & Loza LLP

(57) ABSTRACT

In one embodiment, an apparatus comprises a capacitor and a die. The die comprises a resistor switch coupled between a power line and the capacitor, wherein the resistor switch has an adjustable resistance, and the power line and the capacitor are both external to the die. The die also comprises a circuit configured to receive power from the power line, and a controller configured to open the resistor switch if the power line is powered down.

11 Claims, 16 Drawing Sheets

(51) Int. Cl.
*G06F 1/32* (2006.01)
*H01L 23/62* (2006.01)
*H01L 23/00* (2006.01)
*H01L 49/02* (2006.01)
*H01L 23/498* (2006.01)

(56) References Cited

U.S. PATENT DOCUMENTS

| | | |
|---|---|---|
| 6,949,810 B2 | 9/2005 | Martwick |
| 7,852,145 B2 | 12/2010 | Uematsu et al. |
| 8,164,916 B1 | 4/2012 | Shi |
| 9,377,804 B2 | 6/2016 | Coutts et al. |
| 2004/0183171 A1 | 9/2004 | Breisch et al. |
| 2010/0039099 A1 | 2/2010 | Kim et al. |
| 2010/0211811 A1 | 8/2010 | Zhou et al. |
| 2011/0180898 A1 | 7/2011 | Tomishima et al. |

OTHER PUBLICATIONS

Partial International Search Report—PCT/US2015/019526—ISA/EPO—Jul. 8, 2015.

SWITCHABLE PACKAGE CAPACITOR FOR CHARGE CONSERVATION AND SERIES RESISTANCE

RELATED APPLICATION

This application is a divisional of U.S. application Ser. No. 14/250,150, filed on Apr. 10, 2014, which is incorporated herein by reference in its entirety.

BACKGROUND

Field

Aspects of the present disclosure relate generally to package capacitors, and more particularly, to switchable package capacitors.

Background

A power distribution network (PDN) may be used to distribute power from a power supply (e.g., a battery) to various circuits on a die. Inductance and capacitance in the PDN may cause the impedance of the PDN, as seen by a circuit on the die, to peak at a resonant frequency of the PDN. The peak impedance may cause a large voltage ripple to appear on a power rail of the die when the circuit excites the resonant frequency of the PDN. The ripple may cause circuit elements on the die to malfunction.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, an apparatus is described herein. The apparatus comprises a capacitor and a die. The die comprises a resistor switch coupled between a power line and the capacitor, wherein the resistor switch has an adjustable resistance, and the power line and the capacitor are both external to the die. The die also comprises a circuit configured to receive power from the power line, and a controller configured to open the resistor switch if the power line is powered down.

A second aspect relates to an apparatus. The apparatus comprises a capacitor and a die. The die comprises a resistor switch coupled between a power line and the capacitor, wherein the resistor switch has an adjustable resistance, and the power line and the capacitor are both external to the die. The die also comprises a circuit configured to receive power from the power line, and a resistor controller configured to dynamically adjust the resistance of the resistor switch during power up of the circuit from an inactive state to an active state.

A third aspect relates to a method for tuning a resistance of a resistor switch on a die, wherein the resistor switch is coupled between an external power line and an external capacitor. The method comprises sequentially setting the resistance of the resistor switch to each one of a plurality of resistance values, and, for each resistance value, determining a peak impedance for the resistance value. The method also comprises selecting one of the resistance values based on the determined peak impedances.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
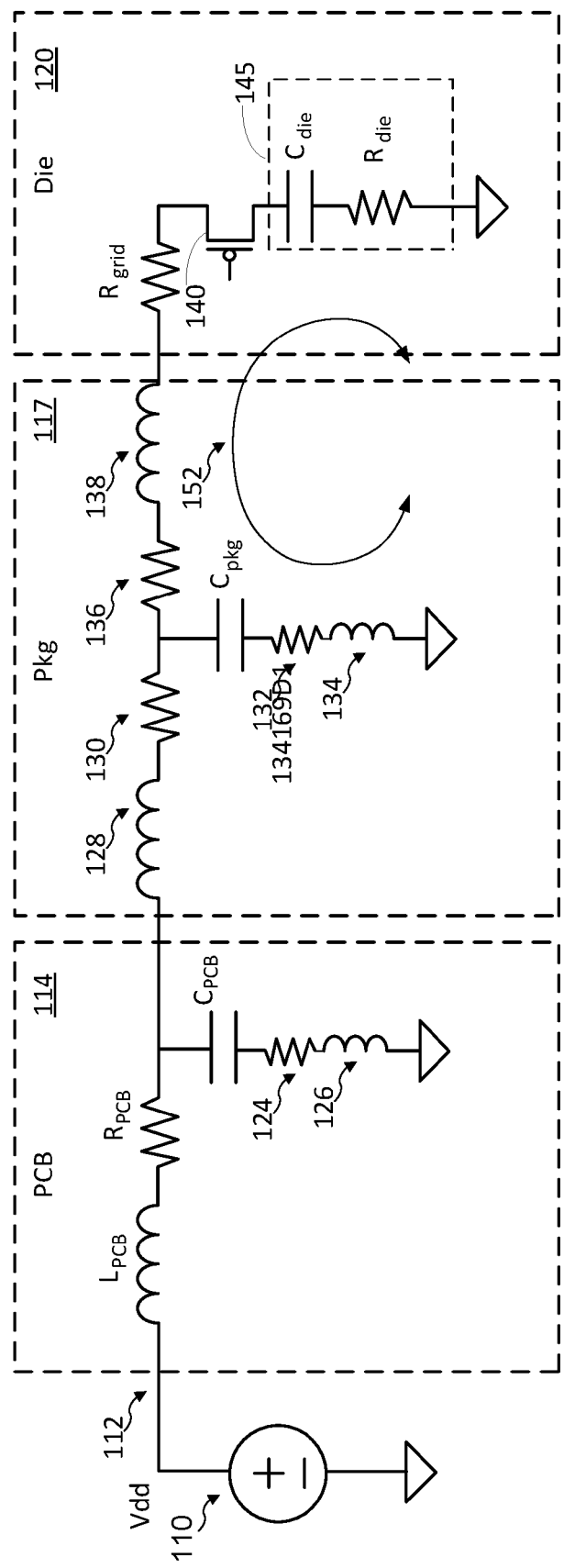
FIG. 1 shows an example of a power distribution network (PDN) for distributing power to one or more circuits on a die according to an embodiment of the present disclosure.

A power distribution network (PDN) is used to distribute power from a power supply (e.g., a battery) to various circuits on a die. FIG. 1 shows an example of a PDN for supplying power from a power supply 110 to a circuit 145 on a die 120. The PDN supplies power to the die 120 via a power supply line 112 that traverses a printed circuit board (PCB) 114 and a package 117. For ease of illustration, a ground line is not shown in FIG. 1. The portion of the PDN corresponding to the PCB 114 may include board inductance modeled as board inductor $L_{PCB}$ and board resistance modeled as board resistor $R_{PCB}$. The PDN may also include a board capacitor $C_{PCB}$, which may have a small amount of inductance and resistance modeled as inductor 126 and resistor 124, respectively.

The portion of the PDN corresponding to the package 117 may include package inductance and package resistance. The PDN may also include a package capacitor $C_{pkg}$, which may have a small amount of inductance and resistance modeled as inductor 134 and resistor 132, respectively. In one embodiment, the package capacitor $C_{Pkg}$ is located within the package 117. As a result, a portion of the package inductance modeled as inductor 128 is located between the power supply 110 and the package capacitor $C_{pkg}$, and another portion of the package inductance modeled as inductor 138 is located between the package capacitor $C_{pkg}$ and the die 120. Similarly, a portion of the package resistance modeled as resistor 130 is located between the power supply 110 and the package capacitor $C_{pkg}$, and another portion of the package resistance modeled as resistor 136 is located between the package capacitor $C_{pkg}$ and the die 120.

The die 120 includes a power grid for supplying power to the circuit 145 from the power supply 110. The power grid includes resistance modeled as grid resistor $R_{grid}$ in FIG. 1. The die 120 also includes a power-gating switch 140 for power gating the circuit 145. For example, the power-gating switch 140 may be configured to connect the circuit 145 to the power grid when the circuit 145 is active, and disconnect the circuit 145 from the power grid when the circuit 145 is inactive (e.g., idle) to conserve power. The circuit 145 has capacitance modeled as die capacitor $C_{die}$ and resistance modeled as die resistor $R_{die}$, as shown in FIG. 1. The capacitance of the circuit 145 may include capacitances of transistors (e.g., metal-oxide-semiconductor field-effect transistors (MOSFETs)) in the circuit 145 and parasitic-wire capacitances in the circuit 145. The resistance of the circuit 145 may include parasitic-wire resistances in the circuit 145.

It is to be appreciated that FIG. 1 is not intended to show all of the capacitances, inductances and/or resistances that may be present in the PDN. Rather, FIG. 1 is intended to show capacitances, inductances and resistances in the PDN that facilitate an understanding of embodiments of the present disclosure discussed below.

Figure 2:
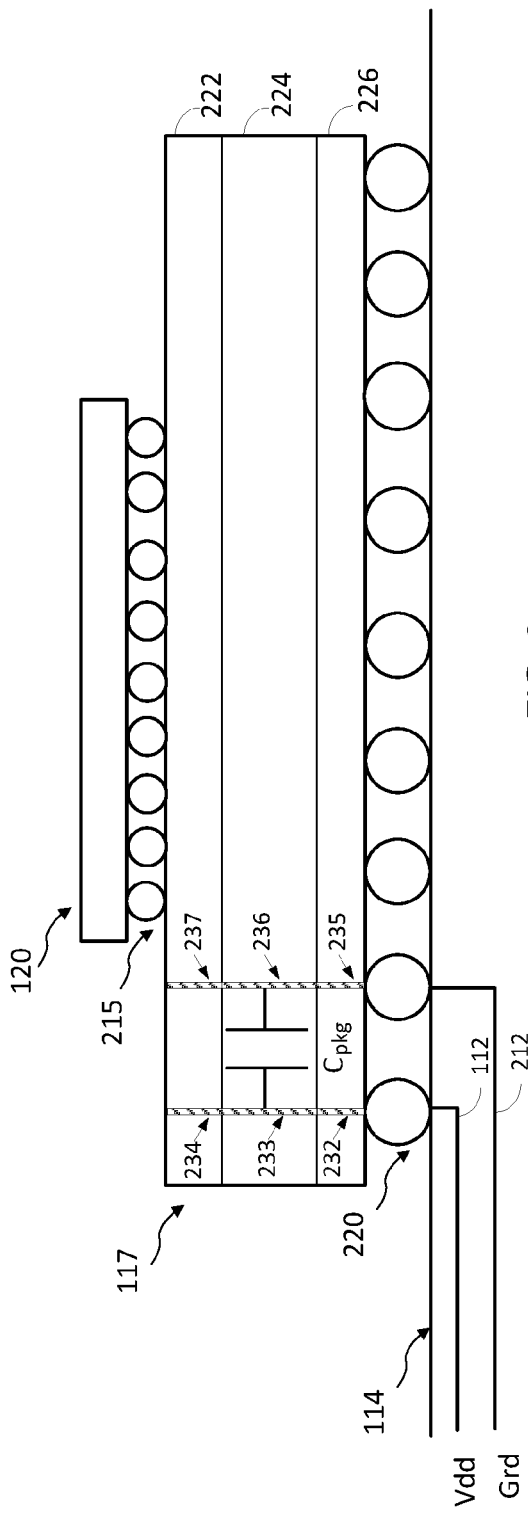
FIG. 2 shows an example of a die and a package according to an embodiment of the present disclosure.

FIG. 2 shows a simplified cross-sectional diagram of the die 120, the package 117, and the PCB 114 according to an embodiment of the present disclosure. The package 117 is mounted on the PCB 114, and the die 120 is mounted on the package 117. Electrical connections between the PCB 114 and the package 117 are provided by solder balls 220, and electrical connections between the package 117 and the die 120 are provided by bumps 215.

In the example shown in FIG. 2, the package 117 comprises a top layer 222, a bottom layer 226, and a center layer 224 between the top and bottom layers 222 and 226. The top and bottom layers 222 and 226 may each comprise one or more glass-epoxy materials (e.g., FR4), and the center layer 224 may comprise one or more ceramic materials. The center layer 224 may have a thickness that is greater than the thickness of each of the top and bottom layers 222 and 226. For example, the center layer 224 may have a thickness (e.g., 60 μm) that is two to four times greater than the thickness (e.g., 20 μm) of each of the top and bottom layers 222 and 226.

Figure 3:
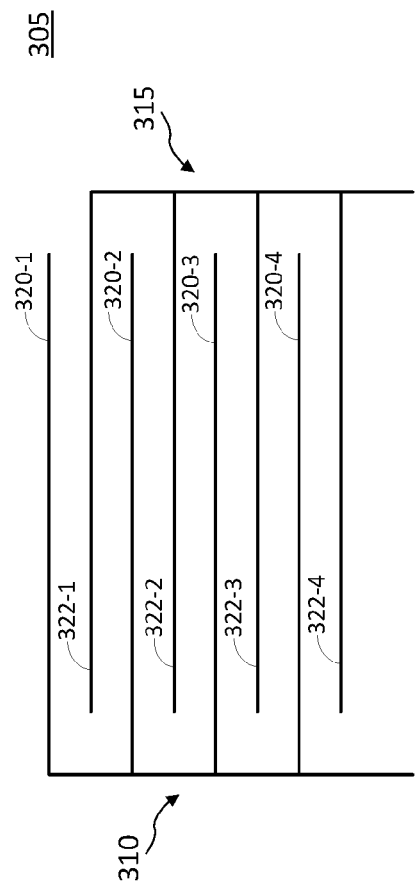
FIG. 3 shows an example of a multilayer package capacitor according to an embodiment of the present disclosure.

As shown in FIG. 2, the package capacitor $C_{pkg}$ may be located within the center layer 224 of the package 117. For example, the package capacitor $C_{pkg}$ may comprise a multilayer ceramic capacitor embedded in the center layer 224. In this regard, FIG. 3 shows an example of a multilayer ceramic capacitor 305 that may be used for the package capacitor $C_{pkg}$. The capacitor 305 comprises a first plurality of metal plates 320-1 to 320-4 coupled to a first metal terminal 310 of the capacitor 305, and a second plurality of metal plates 322-1 to 322-4 coupled to a second metal terminal 315 of the capacitor 305. The metal plates may comprise copper, nickel, silver, tantalum, and/or other type of metal. As shown in FIG. 3, the first plurality of metal plates 320-1 to 320-4 are interlaced with the second plurality of metal plates 322-1 to 322-4. Each pair of adjacent metal plates may be separated by a ceramic layer (not shown) that acts as a dielectric layer between the metal plates. Each ceramic layer may comprise XSR, X7, Y5V and/or other ceramic material.

Returning to FIG. 2, the package 117 also includes vias 232 to 237 for providing conduction paths through the package 117. Each of the vias 232-237 may be formed by creating a hole in one or more layers of the package 117, and filling the hole with metal. The vias 232 to 237 have inductances and resistances contributing to the package inductance and package resistance discussed above.

In the example shown in FIG. 2, vias 232, and 234 form a first conduction path through the bottom, center and top layers 226, 224 and 222, respectively, of the package 117. The first conduction path couples the power supply line 112 (e.g., metal trace) on the PCB 114 to the die 120. Via 232 of the first conduction path may be coupled to the power supply line 112 by one of the solder balls 220. It is to be appreciated that via 232 does not need to be aligned with the respective solder ball. For example, if via 232 is not aligned with the respective solder ball, then via 232 may be coupled to the respective solder ball by a metal trace (not shown) on or near the bottom surface of the package 117. Via 234 of the first conduction path may be coupled to the die 120 by one of the bumps 215. If via 234 is not aligned with the respective bump, then via 234 may be coupled to the respective bump by a metal trace (not shown) on or near the top surface of the package 117.

Vias 235, 236 and 237 form a second conduction path through the bottom, center and top layers 226, 224 and 222, respectively, of the package 117. The second conduction path couples the ground line 212 (e.g., metal trace) on the PCB 114 to the die 120. Via 235 of the second conduction path may be coupled to the ground line by one of the solder balls 220. It is to be appreciated that via 235 does not need to be aligned with the respective solder ball. For example, if via 235 is not aligned with the respective solder ball, then via 235 may be coupled to the respective solder ball by a metal trace (not shown) on or near the bottom surface of the package 117. Via 237 of the second conduction path may be coupled to the die 120 by one of the bumps 215. If via 237 is not aligned with the respective bump, then via 237 may be coupled to the respective bump by a metal trace (not shown) on or near the top surface of the package 117.

The first conductive path may be coupled to one of the terminals of the package capacitor $C_{pkg}$, and the second conductive path may be coupled to the other terminal of the package capacitor $C_{pkg}$. For the example where the package capacitor $C_{Pkg}$ is implemented with the multilayer ceramic capacitor 305, the first conductive path may be coupled to one of the first and second metal terminals 310 and 315 of the capacitor 305, and the second conductive path may be coupled to the other one of the first and second metal terminals 310 and 315 of the capacitor 305. In the example shown in FIG. 2, the package capacitor $C_{pkg}$ is coupled between the power supply 110 and the die 120.

Inductance and capacitance in the PDN may cause the impedance of the PDN, as seen by the circuit 145, to peak at a certain frequency. For example, as shown in FIG. 1, a resistor-inductor-capacitor (RLC) loop 152 (also referred to as an RLC tank) may be formed by the package capacitor $C_{pkg}$, package inductor 138, package resistor 136, grid resistor $R_{grid}$, die capacitor $C_{die}$ and die resistor $R_{die}$. In FIG. 1, the RLC loop 152 has two arrows indicating that current may flow in the RLC loop 152 in either direction. The RLC loop 152 causes the PDN to resonate at a resonant frequency given by:

$$\omega_0 = \frac{1}{\sqrt{LC}} \quad (1)$$

where $\omega_0$ is the resonant angular frequency, L is the inductance of the RLC loop 152, and C is the capacitance of the RLC loop 152. The impedance of the PDN, as seen from the circuit 145, may peak at the resonant frequency of the RLC loop 152, as discussed further below.

Figure 4:
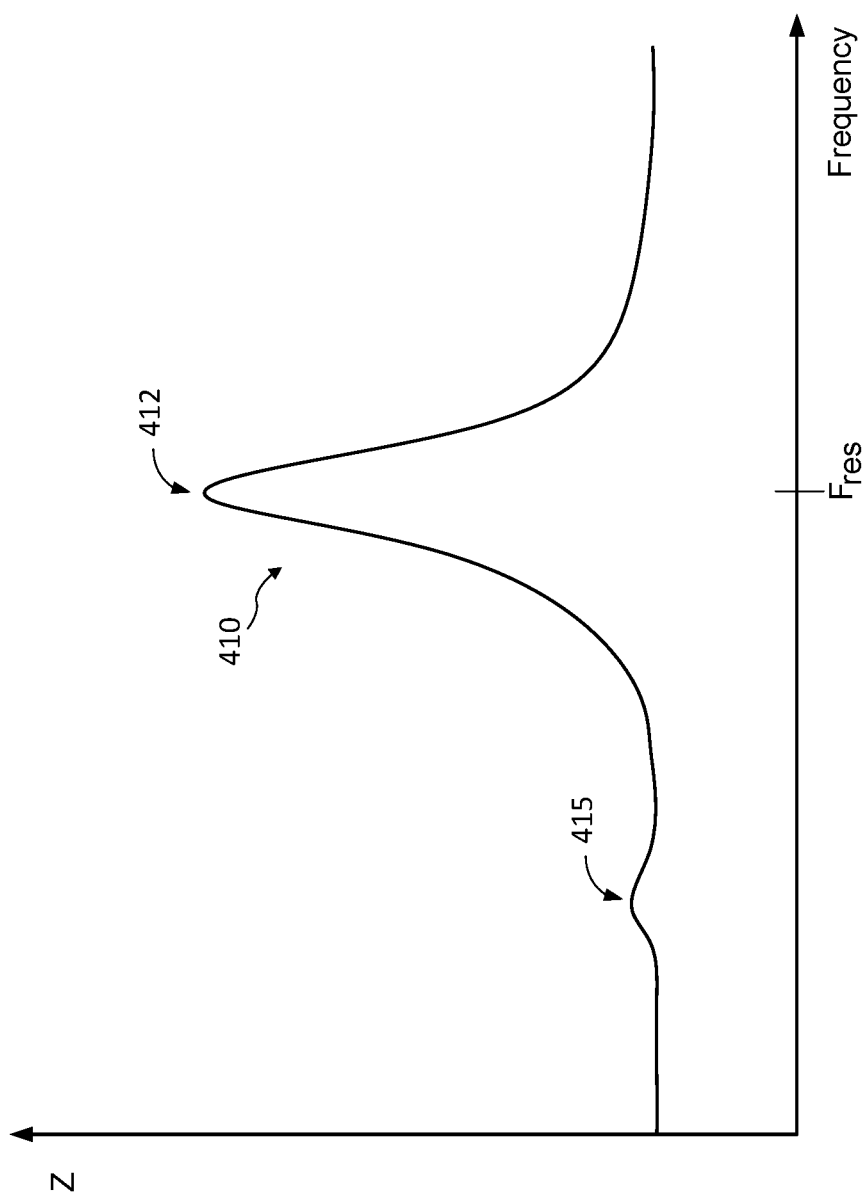
FIG. 4 is a plot showing impedance as a function of frequency according to an embodiment of the present disclosure.

FIG. 4 shows the impedance 410 of the PDN, as seen from the circuit 145, as a function of frequency. As shown in FIG. 4, the impedance 410 peaks at the resonant frequency of the RLC loop 152 (denoted $F_{res}$). The impedance causes a voltage ripple on the power grid when the circuit 145 draws current from the PDN. The amplitude of the ripple is largest at the peak impedance 412, which may occur when the circuit 145 draws a time-varying current having a frequency at the resonant frequency of the RLC loop 152. It is desirable to minimize the amplitude of the ripple on the power grid to ensure that logic connected to the power grid functions properly, and therefore to minimize the peak impedance 412. The impedance 410 may also include a small local peak 415 due to an RLC loop associated with the board capacitor $C_{PCB}$.

Figure 5:
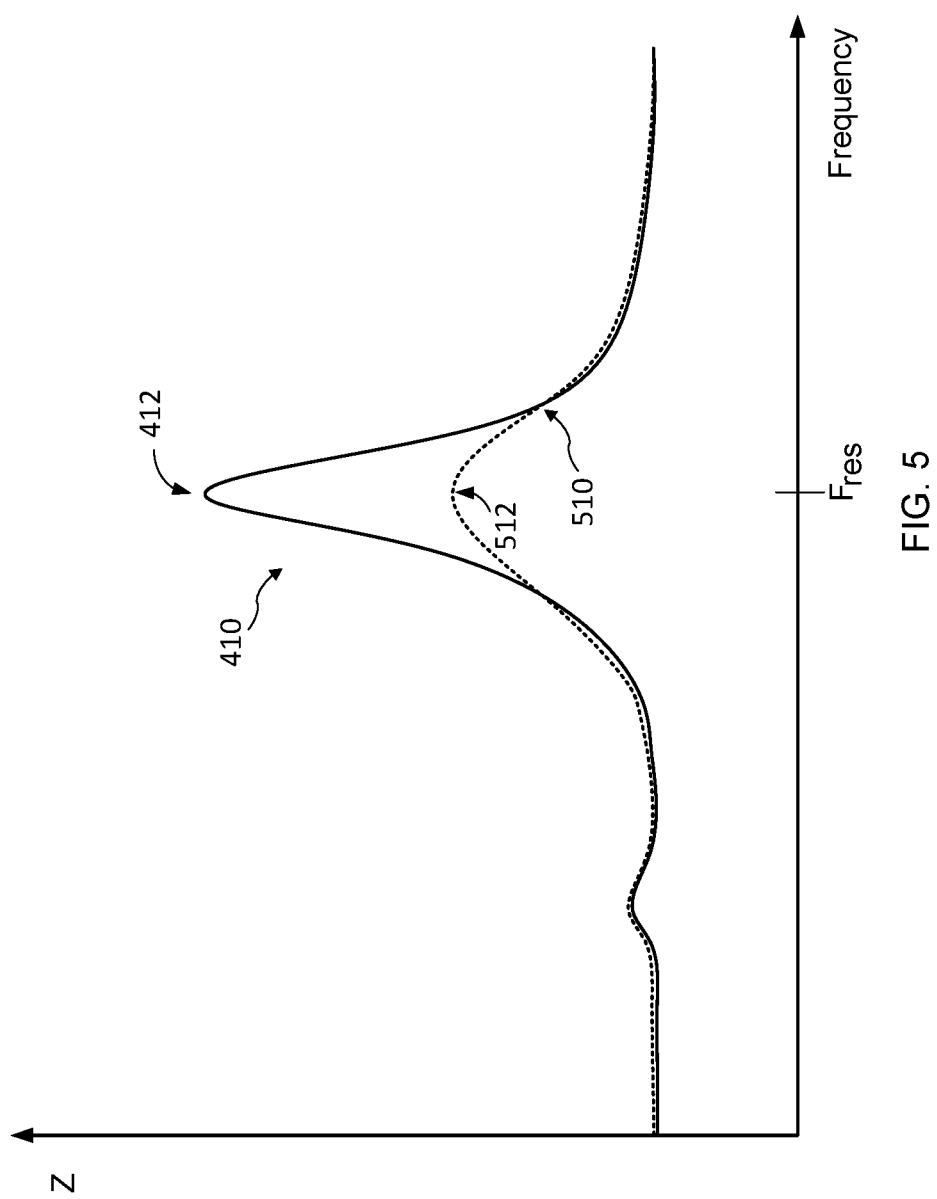
FIG. 5 is a plot showing impedance as a function of frequency for two different resistance values according to an embodiment of the present disclosure.

The peak impedance 412 is controlled by the Q factor of the RLC loop 152, which is the ratio of the energy stored by the RLC loop 152 over the energy dissipated by the RLC loop 152. The lower the Q factor, the lower the peak impedance. The Q factor is inversely proportional to the resistance of the RLC loop 152. Thus, the Q factor (and hence peak impedance 412) can be reduced by increasing the resistance of the RLC loop 152. One approach to increase the resistance of the RLC loop 152 is to increase the resistance of the grid resistor $R_{grid}$. In this regard, FIG. 5 shows the impedance 510 of the PDN in which the resistance of the grid resistor $R_{grid}$ has been increased compared to the impedance 410 in FIG. 4. As shown in FIG. 5, the impedance 510 with the higher grid resistance has a lower peak 512 at the resonant frequency. However, increasing the grid resistance has the undesirable effect of increasing the current-resistor (IR) voltage drop across the grid resistor $R_{grid}$, which reduces the DC supply voltage at the circuit 145. As a result, the power supply 110 needs to output a higher supply voltage in order to achieve a given supply voltage at the circuit 145.

Embodiments of the present disclosure provide a switchable package capacitor that allows the resistance of the RLC loop to be controlled to reduce the peak impedance of the PDN without increasing the IR drop between the power supply 110 and the circuit 145, as discussed further below.

Figure 6:
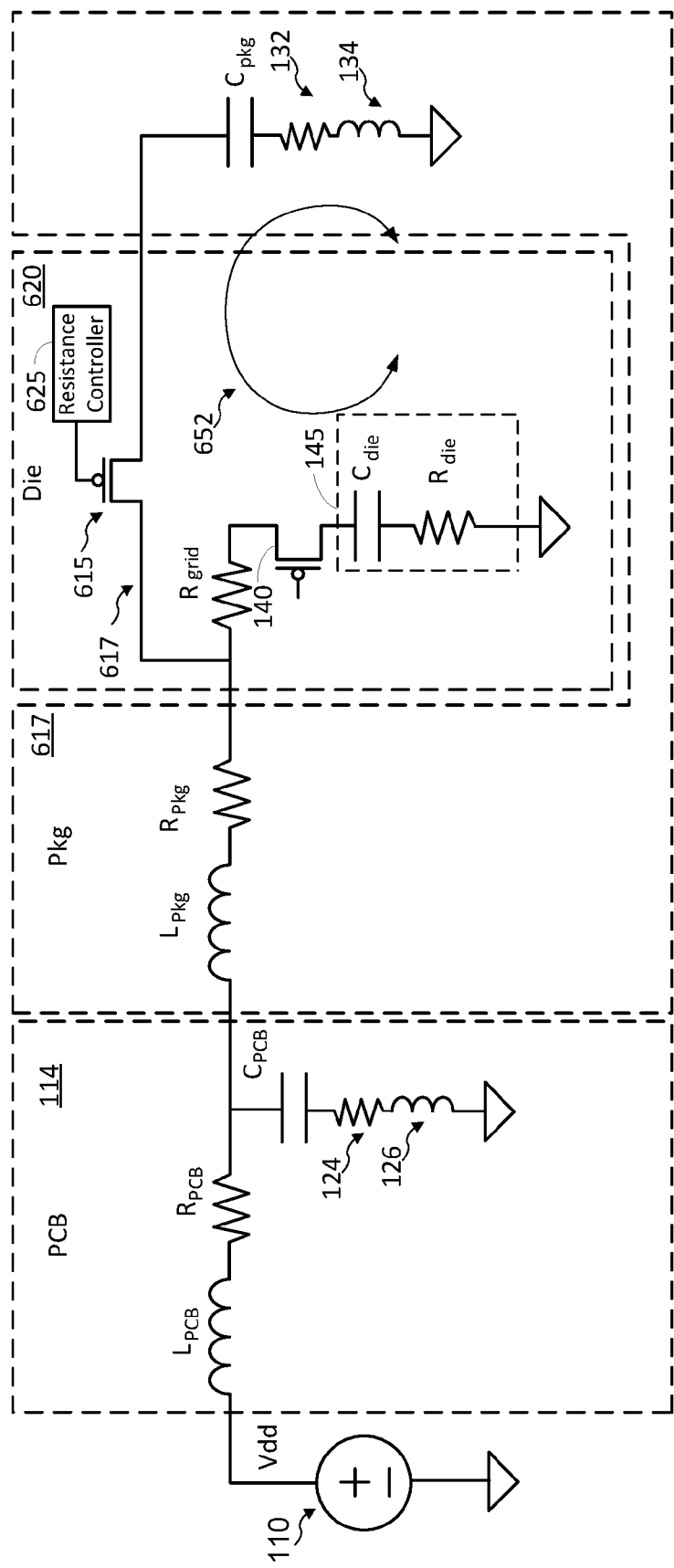
FIG. 6 shows an example of a PDN comprising a switchable package capacitor according to an embodiment of the present disclosure.

FIG. 6 shows a PDN according to an embodiment of the present disclosure. In this embodiment, the die 620 comprises a resistor switch 615 (e.g., PMOS transistor switch) between the package capacitor $C_{pkg}$ and the circuit 145. The resistor switch 615 is included in the RLC loop 652 associated with the package capacitor $C_{pkg}$. As a result, the resistance of the resistor switch 615 contributes to the resistance of the RLC loop 652, and can therefore be used to control the resistance of the RLC loop 652. In this regard, the resistor switch 615 may have a programmable resistance and the die 620 may further include a resistance controller 625 for controlling the resistance of the resistor switch 615, and hence the resistance of the RLC loop 652. For example, the resistance controller 625 may adjust the resistance of the resistor switch 615 to lower the Q factor of the RLC loop 652, and therefore reduce the peak impedance seen by the circuit 145.

The resistance of the resistor switch 615 may be adjusted to increase the resistance of the RLC loop 652 to reduce the peak impedance without increasing the IR drop between the power supply 110 and the circuit 145. This is because the resistor switch 615 is located in a path 617 that is separate from the path between the power supply 110 and the circuit 145. As a result, the resistance of the resistor switch 615 does not contribute to the resistance between the power supply 110 and the circuit 145. Thus, the resistor switch 615 allows the resistance of the RLC loop 652 to be adjusted without negatively impacting the IR drop between the power supply 110 and the circuit 145, and thus without reducing the DC supply voltage at the circuit 145.

In FIG. 6, package inductance between the power supply 110 and the die 620 is modeled as package inductor $L_{pkg}$ and package resistance between the power supply 110 and the die 620 is modeled as package resistor $R_{pkg}$. Package inductance and package resistance between the die 620 and the package capacitor $C_{pkg}$ are not shown in FIG. 6 for ease illustration. It is to be appreciated that the path 617 for the resistor switch 615 may be connected to the power grid at different locations, and is therefore not limited to the exemplary location shown in FIG. 6.

Figure 7:
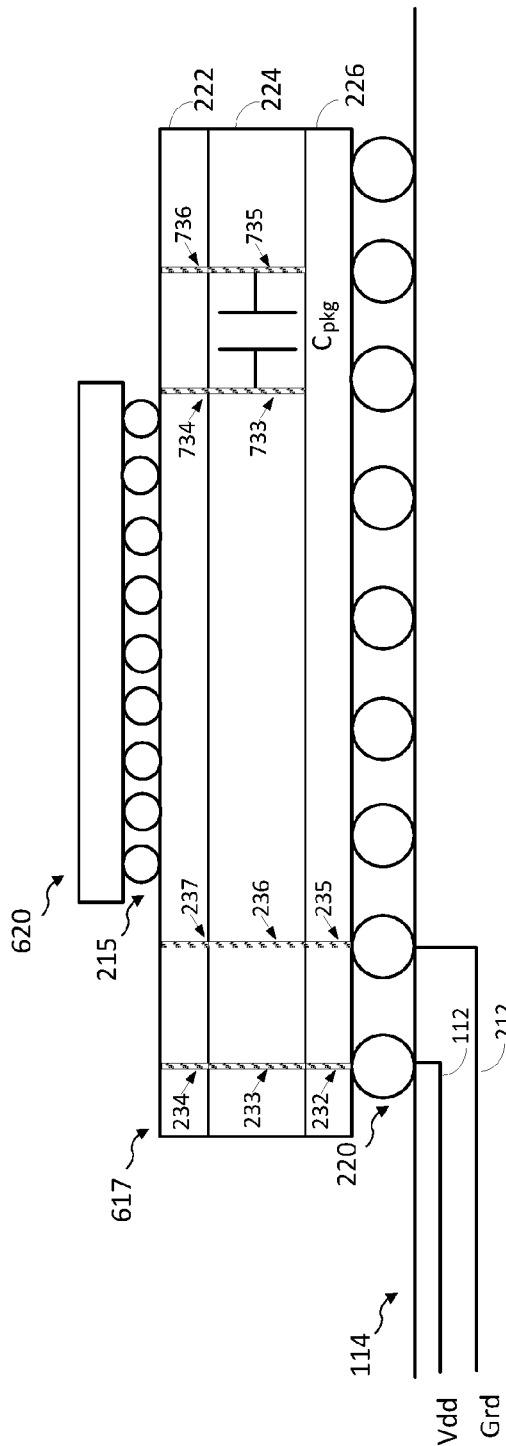
FIG. 7 shows a die and a package with a switchable package capacitor according to an embodiment of the present disclosure.

FIG. 7 shows a simplified cross-sectional diagram of the die 620, the package 617, and the PCB 114 according to an embodiment of the present disclosure. The package 617 is mounted on the PCB 114, and the die 620 is mounted on the package 617. Electrical connections between the PCB 114 and the package 617 are provided by solder balls 220, and electrical connections between the package 617 and the die 620 are provided by bumps 215.

The package 617 in this embodiment differs from the package 117 in FIG. 2 in that the package capacitor $C_{pkg}$ is not coupled to the die 620 by the first and second conduction paths, which couple the power line 112 and the ground line 212 to the die 620. Instead, the package capacitor $C_{pkg}$ is coupled to the die 620 by separate conduction paths in the package 617.

In this regard, the package may include vias 733 to 736 for coupling the package capacitor $C_{pkg}$ to the die 620. Vias 733 and 734 form a third conduction path through the center and top layers 224 and 222, respectively, of the package 617. The third conduction path is used to couple a first terminal of the package capacitor $C_{pkg}$ to the die 620. In this regard, via 733 may be coupled to the first terminal of the package capacitor $C_{pkg}$ and via 734 may be coupled to the die 620 by one of the bumps 215. If via 734 is not aligned with the respective bump, then via 734 may be coupled to the respective bump by a metal trace (not shown) on or near the top surface of the package 617.

Vias 735 and 736 form a fourth conduction path through the center and top layers 224 and 222, respectively, of the package 617. The fourth conduction path is used to couple a second terminal of the package capacitor $C_{pkg}$ to the die 620. In this regard, via 735 may be coupled to the second terminal of the package capacitor $C_{pkg}$ and via 736 may be coupled to the die 620 by one of the bumps 215. If via 736 is not aligned with the respective bump, then via 736 may be coupled to the respective bump by a metal trace (not shown) on or near the top surface of the package 617.

In this embodiment, the third conduction path in the package 617 may be used to couple the first terminal of the package capacitor $C_{pkg}$ to the resistor switch 615 on the die 620 and the fourth conduction path in the package 617 may be used to couple the second terminal of the package capacitor $C_{pkg}$ to a ground line on the die 620. Alternately, the third conduction path may be used to couple the first terminal of the package capacitor $C_{pkg}$ to the ground line on the die 620 and the fourth conduction may be used to couple the second terminal of the package capacitor $C_{pkg}$ to the resistor switch 615 on the die 620. In another example, one of the first and second terminals of the package capacitor $C_{pkg}$ may be connected to the ground line 212 of the PCB 114 by a via (not shown) through the bottom layer 226 of the package 117 and one of the solder balls 220.

The package capacitor $C_{pkg}$ may comprise a multilayer ceramic capacitor embedded in the center layer 224 of the package 617, and/or other type of capacitor. For example, the package capacitor $C_{pkg}$ may be implemented with the multilayer ceramic capacitor 305 shown in FIG. 3. It is to be appreciated that the package capacitor $C_{pkg}$ is not limited to being located within the package 617. For example, the package capacitor $C_{pkg}$ may be mounted on top of the package 617 next to the die 620. In this example, the package capacitor $C_{pkg}$ may be coupled to the die by metal traces on the package 617.

Figure 8:
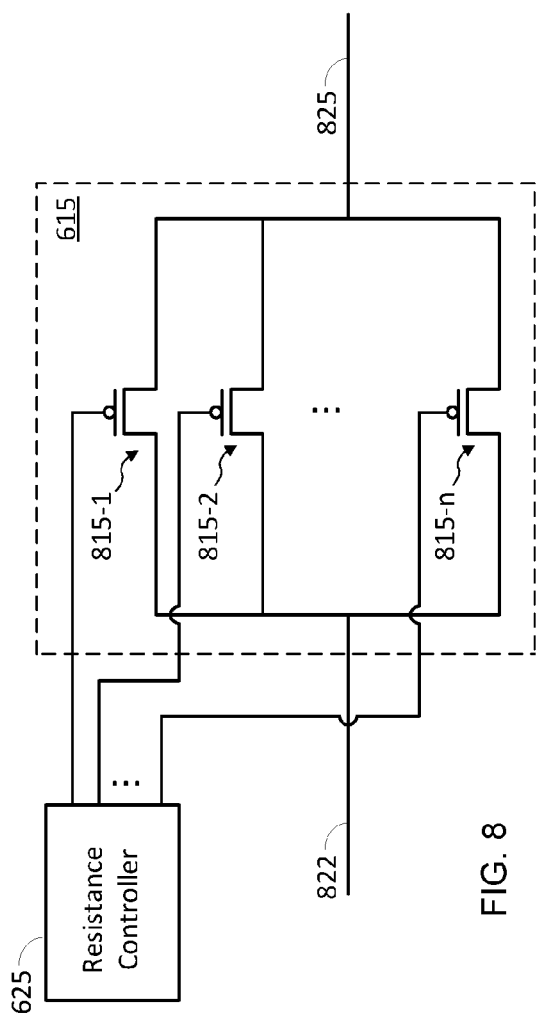
FIG. 8 shows an exemplary implementation of a resistor switch according to an embodiment of the present disclosure.

As discussed above, the resistor switch 615 may have a programmable resistance for controlling the resistance of the RLC loop 652. In this regard, FIG. 8 shows an exemplary implementation of the resistor switch 615 according to an embodiment of the present disclosure. In this embodiment, the resistor switch 615 comprises a plurality of switches 815-1 to 815-n coupled in parallel. The resistance controller 625 controls the resistance of the resistor switch 615 by controlling the number of switches 815-1 to 815-n that are turned on. For example, the resistance controller 625 may reduce the resistance of the resistor switch 615 by turning on more of the switches 815-1 to 815-n, and may increase the resistance of the resistor switch 615 by turning on fewer of the switches 815-1 to 815-n. In FIG. 8, terminal 822 of the switch 615 may be coupled to the circuit 145 and terminal 825 of the resistor switch 615 may be coupled to the package capacitor $C_{pkg}$.

The granularity with which the resistance controller 625 can control the resistance of the resistor switch 615 may depend on the number of switches 815-1 to 815-n in the resistor switch 615. For example, the greater the number of switches 815-1 to 815-n in the resistor switch 615, the greater the granularity with which the resistance controller 625 can control the resistance of the resistor switch 615.

In one embodiment, each switch 815-1 to 815n may comprise a PMOS transistor, as shown in FIG. 8. In this embodiment, the resistance controller 625 may turn on one of the switches 815-1 to 815-n by inputting a logic zero (low voltage) to the gate of the switch, and may turn off one of the switches 815-1 to 815-n by inputting a logic one (high voltage) to the gate of the switch.

Figure 9:
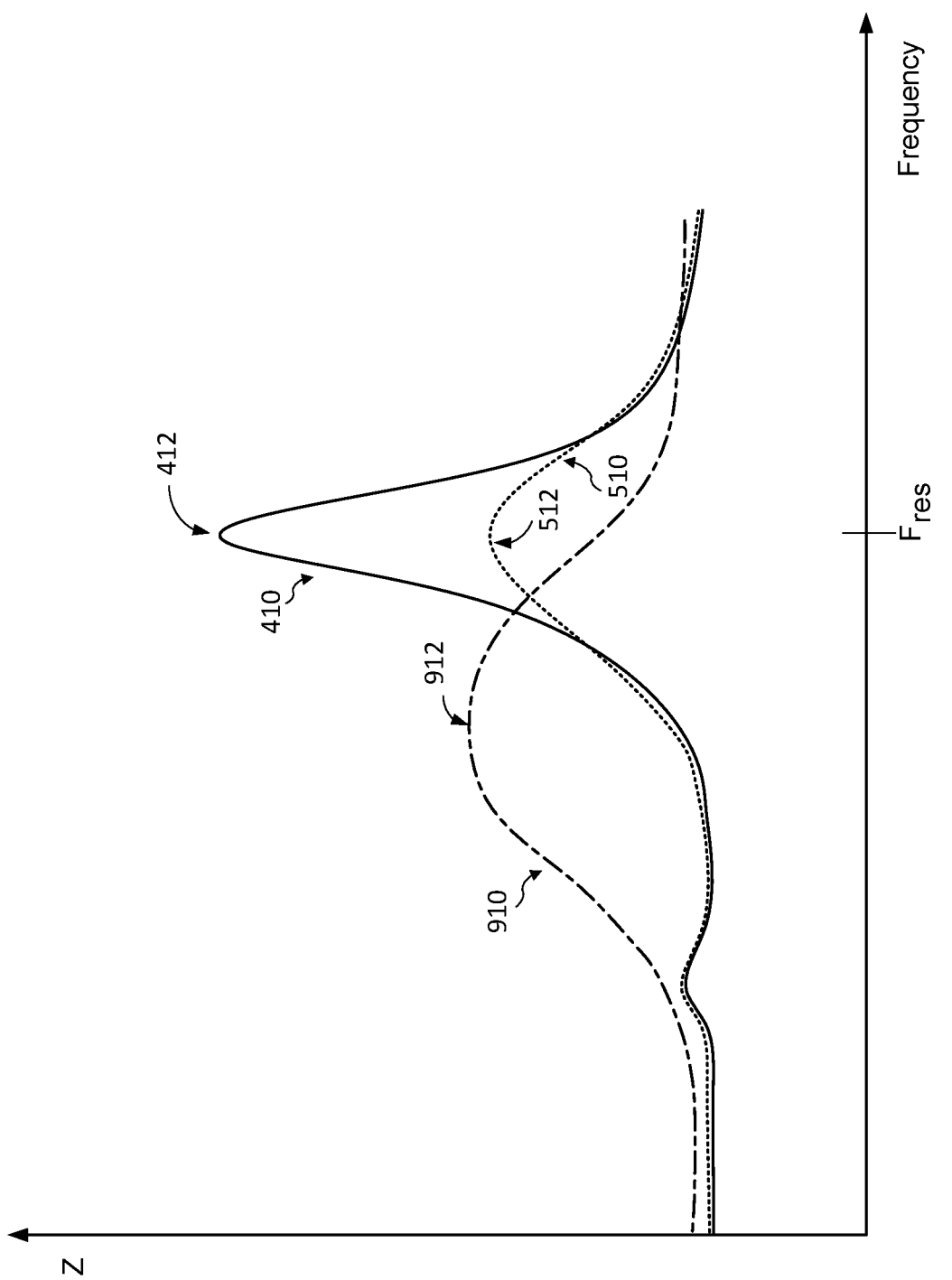
FIG. 9 is a plot showing impedance as a function of frequency for three different switch resistances according to an embodiment of the present disclosure.

FIG. 9 shows impedance seen by the circuit 145 as a function of frequency for three different resistance settings of the resistors switch 615. In particular, impedance 410 is the impedance seen by the circuit 145 as a function of frequency when the resistance of the resistor switch 615 is low, and impedance 910 is the impedance seen by the circuit 145 as a function of frequency when the resistance of the resistor switch 615 is high. Impedance 510 is the impedance seen by the circuit 145 as a function of frequency when the resistance of the resistor switch 615 is between the low and high resistances.

As shown in FIG. 9, when the resistance of the resistor switch 615 is low, the impedance 410 seen by the circuit 145 has a relatively large peak 412 at the resonant frequency of RLC loop 652. When the resistance of the resistor switch 615 is between the low and high resistances, the impedance 510 seen by the circuit 145 has a smaller peak 512 at the resonant frequency. This is because increasing the resistance of the resistance switch 615 increases the resistance of the RLC loop 652. The increased resistance reduces the Q factor of the RLC loop 652, which in turn reduces the peak impedance 512 at the resonant frequency, as discussed above.

The impedance at the resonant frequency may be further reduced by increasing resistance of the resistor switch 615. However, increasing the resistance of the resistor switch 615 further may cause the impedance seen by the circuit 145 to increase at lower frequencies. This is because increasing the resistance of the resistor switch 615 reduces the ability of the package capacitor $C_{pkg}$ to supply charge to the power grid to reduce voltage droops on the power grid. As a result, when the resistance of the resistor switch 615 is high, the impedance 910 seen by the circuit 145 has a larger peak 912 at lower frequencies, which can lead to higher voltage ripples on the power grid at lower frequencies. Accordingly, it may be desirable to tune the resistance of the resistor switch 615 to achieve a desired reduction in the peak impedance.

Figure 10:
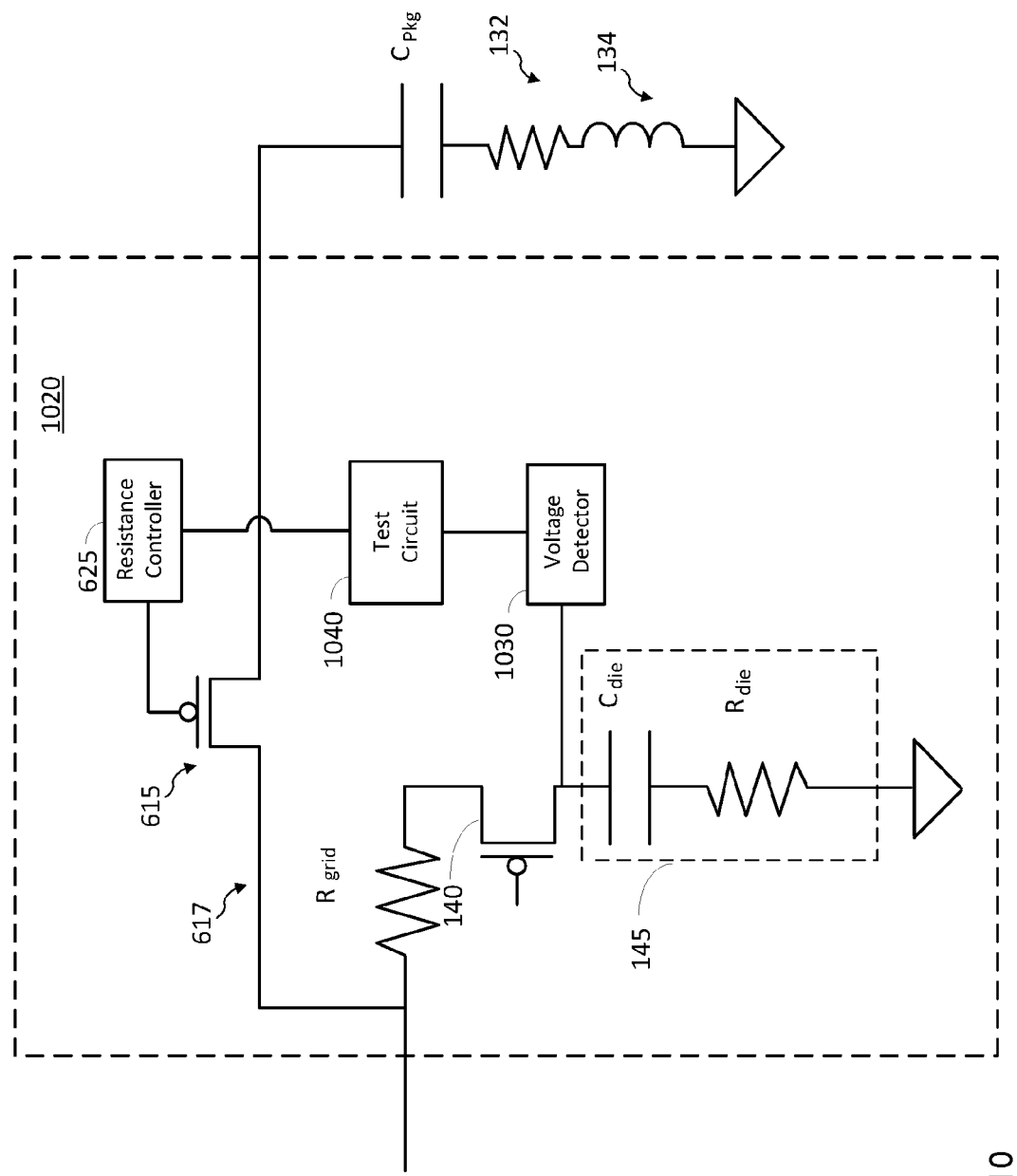
FIG. 10 shows circuitry for tuning the resistance of a resistor switch according to an embodiment of the present disclosure.

In this regard, FIG. 10 shows circuitry for tuning the resistance of the resistor switch 615 according an embodiment of the present disclosure. The circuitry includes a voltage detector 1030 and a test circuit 1040. The voltage detector 1030 is configured to measure the supply voltage at the circuit 145. To do this, the voltage detector 1030 may be coupled between the power-gating switch 140 and the circuit 145. Alternatively, the voltage detector 1030 may be coupled between the power-gating switch 140 and the power grid.

The test circuit 1040 is configured to perform a procedure for tuning the resistance of the resistor switch 615. In this regard, the circuit 145 may be coupled to the power supply 110 by the power-gating switch 140. The test circuit 1040 may then instruct the resistance controller 625 to sequentially set the resistance of the resistor switch 615 to each one of a plurality of different resistance values. For each resistance value, the test circuit 1040 may determine the peak impedance across a frequency range based on voltage measurements from the voltage detector 1030. The test circuit 1040 may then select the resistance value corresponding to the lowest peak impedance. Alternatively, the test circuit 1040 may select any one of the resistance values corresponding to a peak impedance that is equal to or below a peak-impedance threshold. The peak-impedance threshold may be an impedance corresponding to a minimum supply voltage that is needed by one or more circuits on the die to function properly, as discussed further below. The test circuit 1040 may then instruct the resistance controller 625 to set the resistance of the switch resistor 615 to the selected resistance value.

It is to be appreciated that the peak impedance determined for each resistance value is not necessarily the absolute peak impedance for the resistance value. For example, the impedance for a particular resistance value may be determined for each one of a plurality of different frequencies. In this example, the frequency at which the absolute peak impedance for the resistance value occurs may not exactly match one of the plurality of frequencies, in which case the determined peak impedance approximates the absolute peak impedance.

The test circuit 1040 may determine the peak impedance for a particular resistance value according to the following procedure. In this regard, the circuit 145 may be coupled to the power supply 110 by the power-gating switch 140 and operated across a frequency range of interest. As the circuit 145 is operated across the frequency range, the voltage detector 1030 may measure the supply voltage at the circuit 145 and output the resulting voltage measurements to the test circuit 1040. The test circuit 1040 may keep track of the minimum (smallest) measured voltage received from the voltage detector 1030. After the circuit 145 completes operations across the frequency range, the test circuit 1040 may record the minimum measured voltage for the resistance value. The minimum measured voltage provides an indication of the peak impedance for the resistance value, in which a higher minimum measured voltage is indicative of a lower peak impedance and a lower minimum measured voltage is indicative of a higher peak impedance.

The test circuit 1040 may repeat the above procedure for each resistance value to determine the minimum measured voltage for each resistance value. The test circuit 1040 may then select the resistance corresponding to the highest minimum measured voltage, and hence lowest peak impedance. Alternatively, the test circuit 1040 may select any one of the resistance values corresponding to a minimum measured voltage that is equal to or greater than a minimum-voltage threshold. The minimum-voltage threshold may correspond to a minimum supply voltage needed for one or more circuits on the die 620 to function properly. The test circuit 1040 may then instruct the resistance controller 625 to set the resistance of the resistor switch 615 to the selected resistance value.

Figure 11:
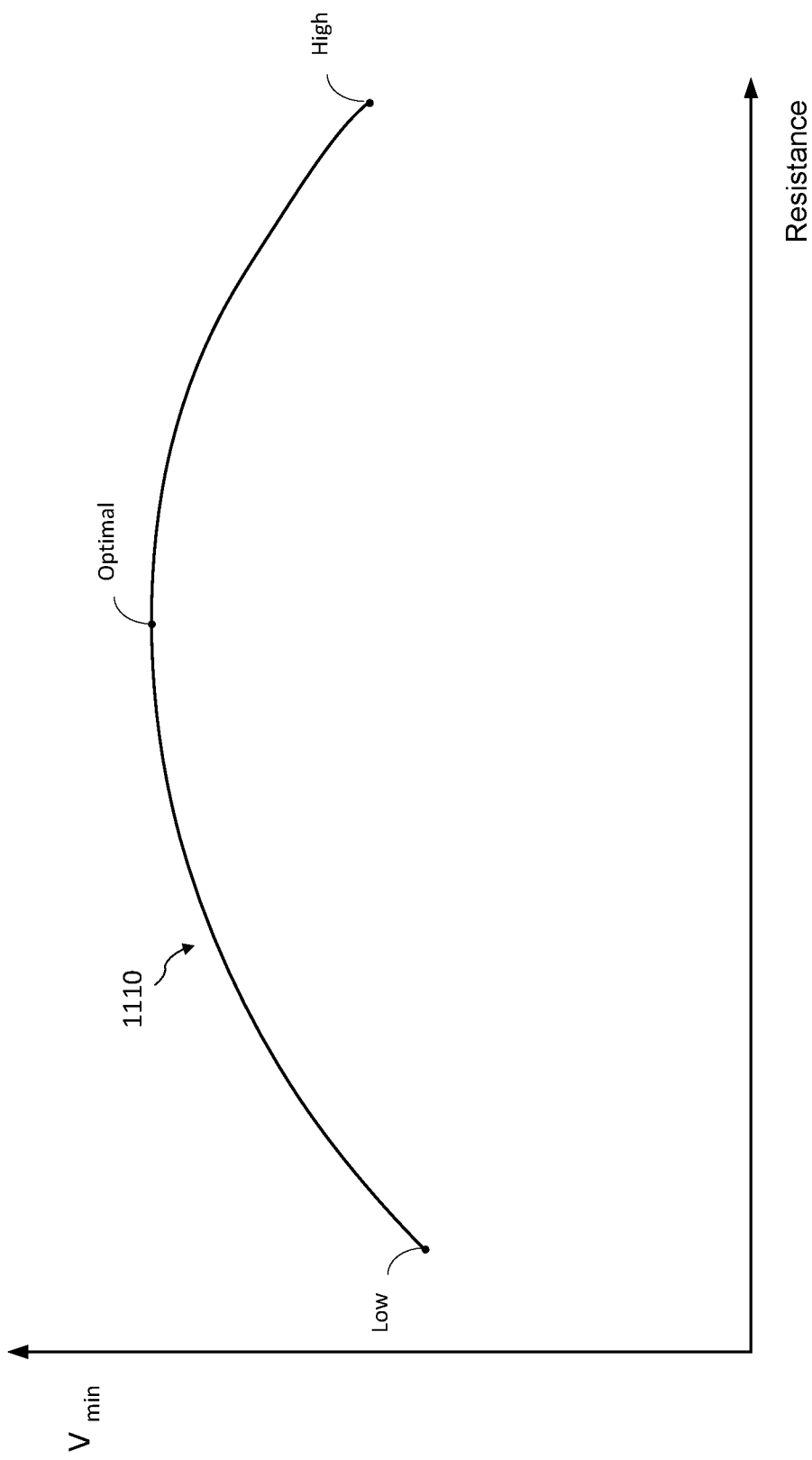
FIG. 11 is a plot showing minimum measured voltage as a function of switch resistance according to an embodiment of the present disclosure.

FIG. 11 shows an exemplary plot of the minimum measured voltage as a function of resistance of the resistor switch 615. For example, the plot may be generated by having the resistance controller 625 sequentially set the resistance of the resistor switch 615 to each one of a plurality of different resistance values, and recording the minimum measured voltage for each resistance. In the example shown in FIG. 11, the resistance of the resistor switch 615 is varied across a range bounded by a low resistance and a high resistance. The highest minimum measured voltage (and hence lowest peak impedance) occurs at an optimal resistance between the low and high resistances. In FIG. 11, the minimum measured voltages corresponding to the low resistance, optimal resistance, and high resistance are denoted low, optimal, and high, respectively.

Although both the voltage detector 1030 and test circuit 1040 are located on the die 1020 in the example shown in FIG. 10, it is to be appreciated that one of the voltage detector 1030 and test circuit 1040 may be external to the die 1020 or both of the voltage detector 1030 and test circuit 1040 may be external to the die 1020.

Figure 12:
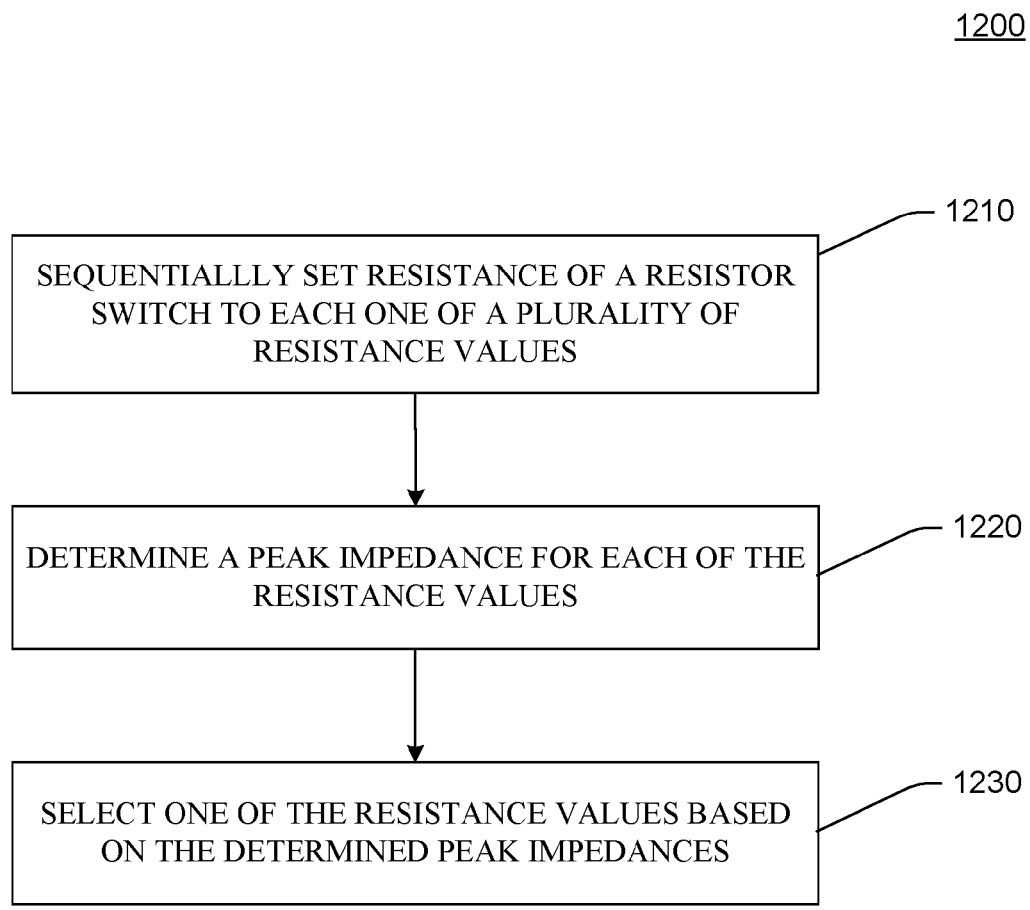
FIG. 12 is a flow diagram illustrating a method for tuning the resistance of a resistor switch according to an embodiment of the present disclosure.

FIG. 12 is a flow diagram illustrating a method 1200 for tuning the resistance of a resistor switch according to an embodiment of the present disclosure. The resistor switch (e.g., resistor switch 615) may be on a die (e.g., die 620) and may be coupled between an external power line (e.g., power line 112) and an external capacitor (e.g., package capacitor $C_{pkg}$). The method 1200 may be performed by the voltage detector 1030 and the test circuit 1040.

In step 1210, the resistance of the resistor switch is sequentially set to each one of a plurality of resistance values. This may be done, for example, by instructing a resistance controller (e.g., resistance controller 625) that controls the resistance of the resistor switch (e.g., resistor switch 615) to sequentially set the resistance of the resistor switch to each one of the resistance values.

In step 1220, a peak impedance is determined for each one of the resistance values. For example, the peak impedance for each resistor value may be determined by operating a circuit (e.g., circuit 145) coupled to the external power line across a frequency range, measuring a supply voltage of the circuit as the circuit is operated across the frequency range, and recording a minimum measured voltage. In this example, the minimum measured voltage for each resistance value may correspond to the peak impedance for the resistance value.

In step 1230, one of the resistance values is selected based on the determined peak impedances. For example, the resistance value corresponding to a lowest one of the determined peak impedances may be selected. For the example in which the peak impedance for each resistance value is determined based on the minimum measured voltage for the resistance value, the resistance value corresponding to the highest minimum measured voltages may be selected. Alternatively, any one of the resistance values corresponding to a minimum measured voltage that is equal to or greater than a minimum-voltage threshold may be selected. The method may further include setting the resistance of the resistor switch to the selected resistance value.

Thus, embodiments of the present disclosure allow the resistance of the resistor switch 615 to be tuned for a particular die. The ability to tune the resistance of the switch resistor 615 provides an advantage over using a fixed resistor (e.g., metal resistor) to control the resistance of the RLC loop 652. This is because the resistance of a fixed resistor typically has to be determined before fabrication. For example, the resistance of a metal resistor needs to be determined before fabrication in order to specify the dimensions of the metal resistor. However, the resistance needed to achieve a desired reduction in the peak impedance for a particular die may not be known until after the die has been fabricated due to process variations and/or other factors. As a result, the resistance of the fixed resistor may not achieve the desired reduction in the peak impedance. Embodiments of the present disclosure overcome the above drawbacks of using a fixed resistor. This is because the resistance of the resistor switch 615 can be tuned to a resistance value that achieves a desired reduction in the peak impedance for a particular die after fabrication.

Figure 13:
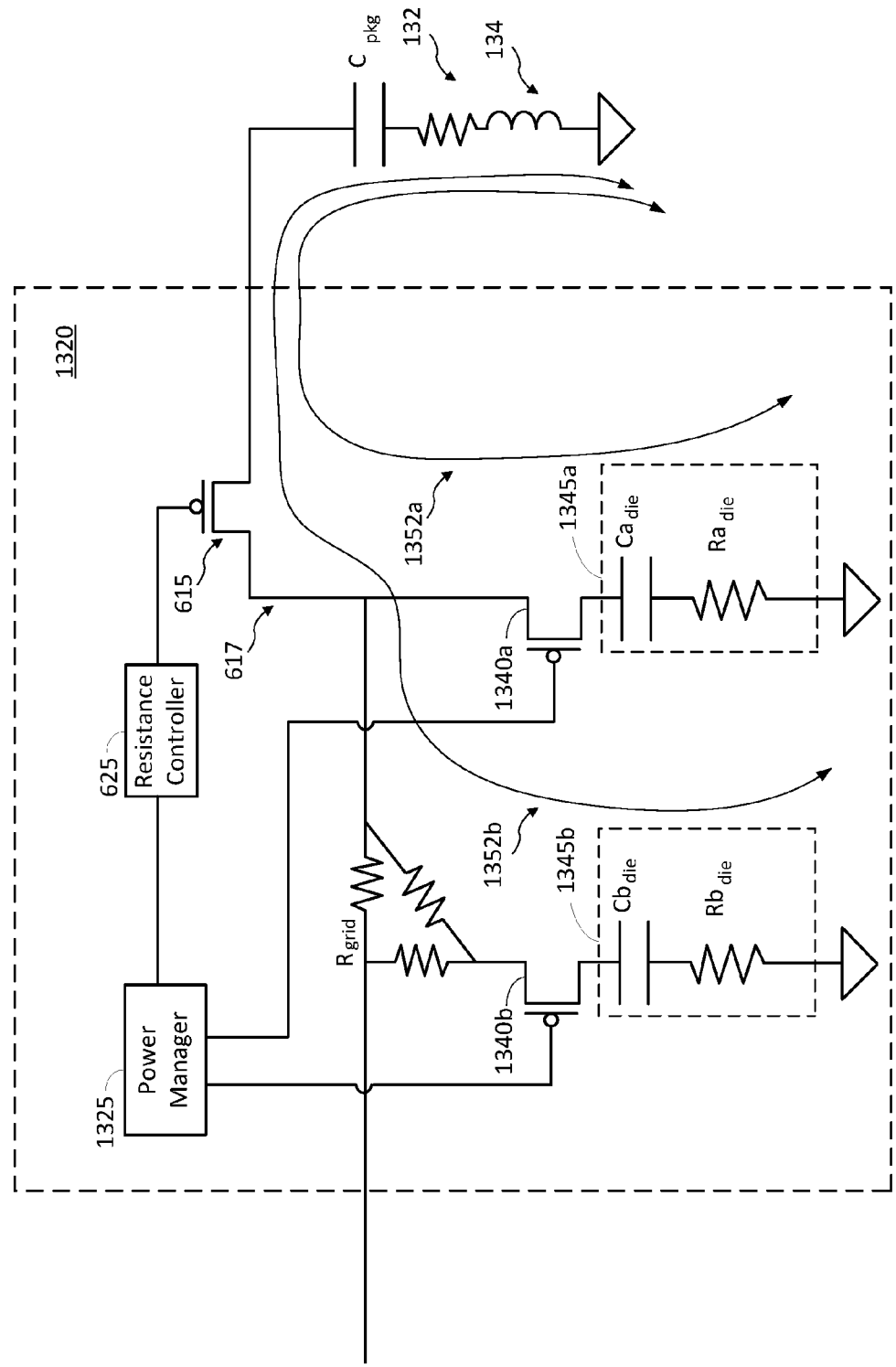
FIG. 13 shows a die comprising two circuits and a package comprising a switchable package capacitor according to an embodiment of the present disclosure.

Although FIG. 6 shows one power-gated circuit 145 for ease of illustration, it is to be appreciated that a die may include two or more power-gated circuits. In this regard, FIG. 13 shows a die 1320 comprising a first power-gated circuit 1345a and a second power-gated circuit 1345b according to an embodiment of the present disclosure. For example, the first and second circuits 1345a and 1345b may comprise first and second processors (e.g., central processing units (CPUs)) of a multi-core system on a chip (SoC). The first circuit 1345a has die capacitance modeled as die capacitor $Ca_{die}$, and resistance modeled as die resistor $Ra_{die}$, and the second circuit 1345b has capacitance modeled as die capacitor $Cb_{die}$ and resistance modeled as die resistor $Rb_{die}$.

The die 1320 also includes a power manager 1325 and first and second power-gating switches 1340a and 1340b. The first power-gating switch 1340a is coupled between the power grid and the first circuit 1345a, and the second power-gating switch 1340b is coupled between the power grid and the second circuit 1345b. The power manager 1325 is configured to manage power to each of the first and second circuits 1345a and 1345b by controlling the respective power-gating switch 1340a and 1340b. For example, the power manager 1325 may connect the first circuit 1345a to the power grid when the first circuit 1345a is active by turning on the first power-gating switch 1340a, and may disconnect the first circuit 1345a from the power grid when the first circuit 1345a is inactive (e.g., idle) by turning off the first power-gating switch 1340a. Similarly, the power manager 1325 may connect the second circuit 1345b to the power grid when the second circuit 1345b is active by turning on the second power-gating switch 1340b, and may disconnect the second circuit 1345b from the power grid when the second circuit 1345b is inactive (e.g., idle) by turning off the second power-gating switch 1340b.

The power manager 1325 may independently control the first and second power-gating switches 1345a and 1345b, and therefore independently power gate the first and second circuits 1345a and 1345b. For example, the power manager 1325 may independently power gate the first and second circuits 1345a and 1345b based on usage of the first and second circuits 1345a and 1345b. In the example shown in FIG. 13, each power-gating switch 1345a and 1345b comprises a PMOS transistor. In this example, the power manager 1325 may turn on one of the power-gating switches 1345a and 1345b by driving the gate of the switch low, and may turn off one of the power-gating switches 1345a and 1345b by driving the gate of the switch high.

The die 1320 includes the resistor switch 615 between the power grid and the package capacitor $C_{pkg}$. In the example shown in FIG. 13, the first circuit 1345a, the resistor switch 615 and the package capacitor $C_{pkg}$ form a first RLC loop 1352a, and the second circuit 1345b, the resistor switch 615 and the package capacitor $C_{pkg}$ form a second RLC loop 1352b. The first and second RLC loops 1352a and 1352b share the resistor switch 615. Thus, the resistor switch 615 may be used to adjust the resistance of each RLC loop 1352a and 1352b.

Although the first and second RLC loops 1352a and 1352b share the resistor switch 615, the first and second RLC loops 1352a and 1352b may have different resistances. This is because the first and second circuits 1345a and 1345b connect to the power grid at different locations. As a result, the amount of grid resistance in each RLC loop is different.

In FIG. 13, the grid resistance between the first and second circuits 1345a and 1345b is modeled as grid resistor $R_{grid}$. The grid resistance between the first circuit 1345a and the resistor switch 615 and the grid resistance between the second circuit 1345b and the power supply 110 are not shown in FIG. 13 for ease of illustration.

Because the first and second RLC loops 1352a and 1352b have different resistances, the peak impedance seen by each of the first and second circuits 1345a and 1345b may be minimized at a different resistance setting of the resistor switch 615. In this regard, the resistance of the resistor switch 615 may be separately tuned for each of the first and second circuits 1345a and 1345b to determine a resistance value for each circuit.

For example, the first circuit 1345a may be connected to the power grid by the first power-gating switch 1340a with the second circuit 1345b disconnected from the power grid. The resistance of the resistor switch 615 may then be tuned by performing any one of the tuning procedures discussed above to determine a resistance value for the first circuit 1345a. Similarly, the second circuit 1345b may be connected to the power grid by the second power-gating switch 1340b with the first circuit 1345a disconnected from the power grid. The resistance of the resistor switch 615 may then be tuned by performing any one of the tuning procedures discussed above to determine a resistance value for the second circuit 1345b. The resistance values for the first and second circuits 1345a and 1345b may be stored in memory on the die 1320.

Figure 14:
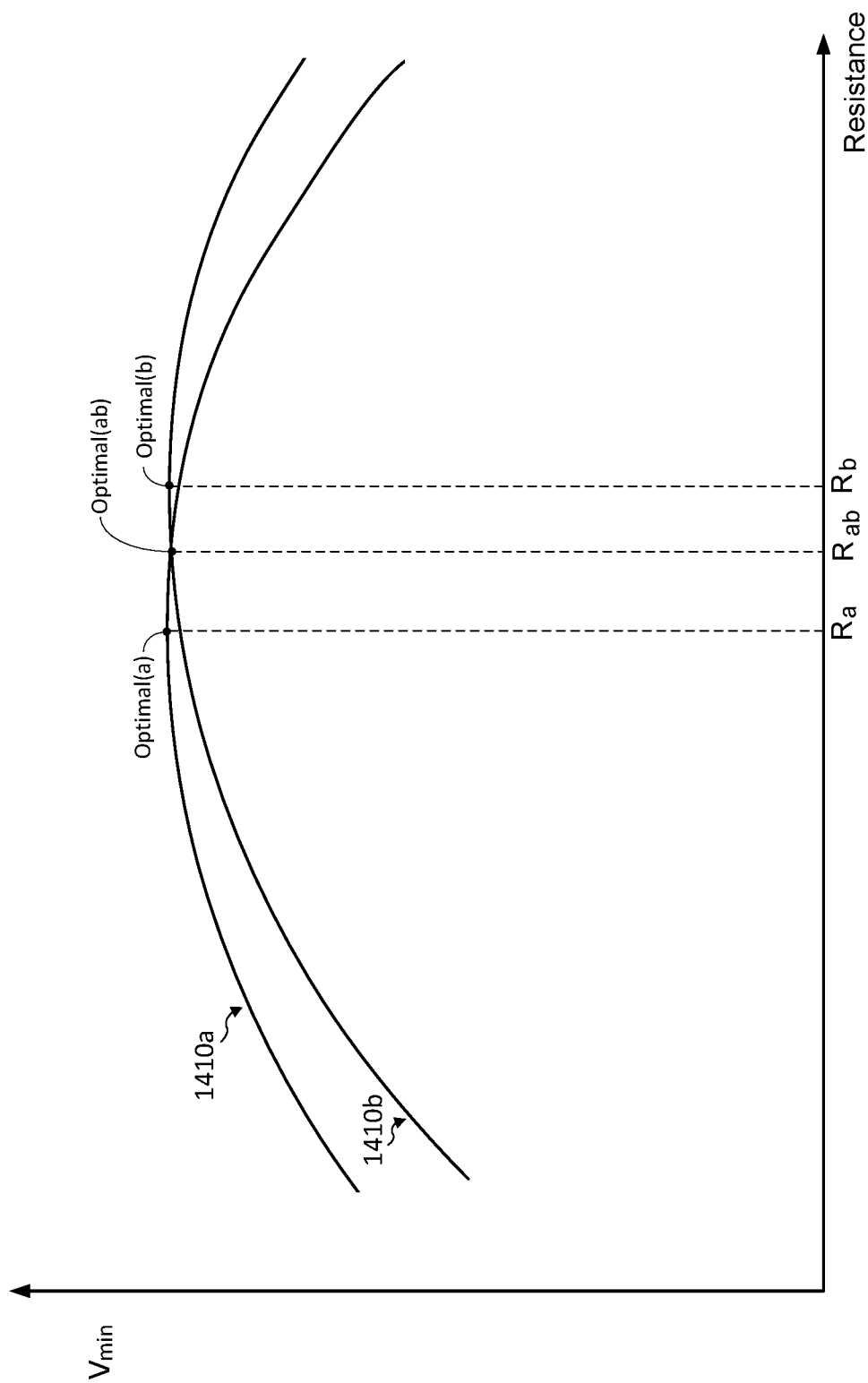
FIG. 14 is a plot showing minimum measured voltage as a function of switch resistance for different use cases according to an embodiment of the present disclosure.

In one embodiment, the resistance value for each circuit 1345a and 1345b may be determined based on the resistance value corresponding to the highest minimum measured voltage (and hence lowest peak impedance) for each circuit 1345a and 1345b. In this regard, FIG. 14 shows minimum measured voltage 1410a as a function of resistance for the first circuit 1345a, and minimum measured voltage 1410b as a function of resistance for the second circuit 1345b. As shown in FIG. 14, the highest minimum measured voltage (and hence lowest peak impedance) for the first circuit 1345a occurs at a resistance value of $R_a$, and the highest minimum measured voltage (and hence lowest peak impedance) for the second circuit 1345b occurs at a resistance value of $R_b$. Thus, in this example, the resistance value for the first circuit 1345a is $R_a$ and the resistance value for the second circuit 1345b is $R_b$. In FIG. 14, the minimum measured voltages corresponding to resistance values $R_a$ and $R_b$ are denoted optimal(a) and optimal(b), respectively.

A resistance value for the case where both circuits 1345a and 1345b are active may also be determined. For example, the resistance value for this case may be a resistance value that is between (e.g., midway between) the resistance values for the first and second circuits 1345a and 1345b. Referring to FIG. 14, in another example, the resistance value for this case may be a resistance value of $R_{ab}$ at which the minimum measured voltage for both circuits 1345a and 1345b is highest. In FIG. 14, the minimum measured voltage corresponding to the resistance value of $R_{ab}$ is denoted optimal (ab).

After the resistance values for the different use cases have been determined, the resistance controller 625 may set the resistance of the resistor switch 615 depending on the activity of the circuits 1345a and 1345b. For example, when the first circuit 1345a is active and the second circuit 1345b is inactive, the resistance controller 625 may set the resistance of the resistor switch 615 to the resistance value of $R_a$. When the second circuit 1345b is active and the first circuit 1345a is inactive, the resistance controller 625 may set the resistance of the resistor switch 615 to the resistance value of $R_b$. When both circuits 1345a and 1345b are active, the resistance controller 625 may set the resistance of the resistor switch 615 to the resistance value of $R_{ab}$. In this example, the resistance controller 625 may receive a signal from the power manager 1325 indicating which circuits 1345a and 1345b are active at a given time.

It is to be appreciated that embodiments of the present disclosure are not limited to a die with two power-gated circuits, and may be implemented on a die with three or more power-gated circuits. For example, embodiments of the present disclosure may be implemented on a die with three power-gated circuits labeled circuit A, circuit B and circuit C. In this example, a resistance value for each individual circuit may be determined. A resistance value may also be determined for each one of the following cases: circuits A and B are active and circuit C is inactive, circuits A and C are active and circuit B is inactive, circuits B and C are active and circuit A is inactive, and circuits A, B and C are all active. In this example, after the resistance values for the different cases are determined, the resistance controller 625 may adjust the resistance of the resistor switch 615 according to the activity of the circuits. For example, if circuits A and B are active and circuit C in inactive, then the resistance controller 625 may set the resistance of the resistor switch 615 to the resistance value determined for the case where circuits A and B are active and circuit C is inactive. The resistance controller 625 may receive a signal from the power manager 1325 indicating the activity of the circuits at a given time.

In one embodiment, the resistance controller 625 may selectively disconnect the package capacitor $C_{pkg}$ from the power line 112 by opening the resistor switch 615. For example, the resistance controller 625 may disconnect the package capacitor $C_{pkg}$ from the power line 112 when the power line 112 is powered down and reconnect the package capacitor $C_{pkg}$ to the power line 112 after the power line 112 has been powered back on. This allows the package capacitor $C_{pkg}$ to retain charge when the power line 112 is powered down. As a result, when the power line 112 is powered back on, the amount of charge needed from the power supply 110 to recharge the package capacitor $C_{pkg}$ can be significantly reduced (assuming the package capacitor $C_{pkg}$ has low leakage). In contrast, when the power line 112 in FIG. 1 is powered down, the package capacitor $C_{pkg}$ is discharged (the voltage of the package capacitor $C_{Pkg}$ collapses). In this embodiment, the resistance controller 625 may receive a signal from the power manager 1325 indicating when the power line 112 is powered up and powered down.

Figure 15:
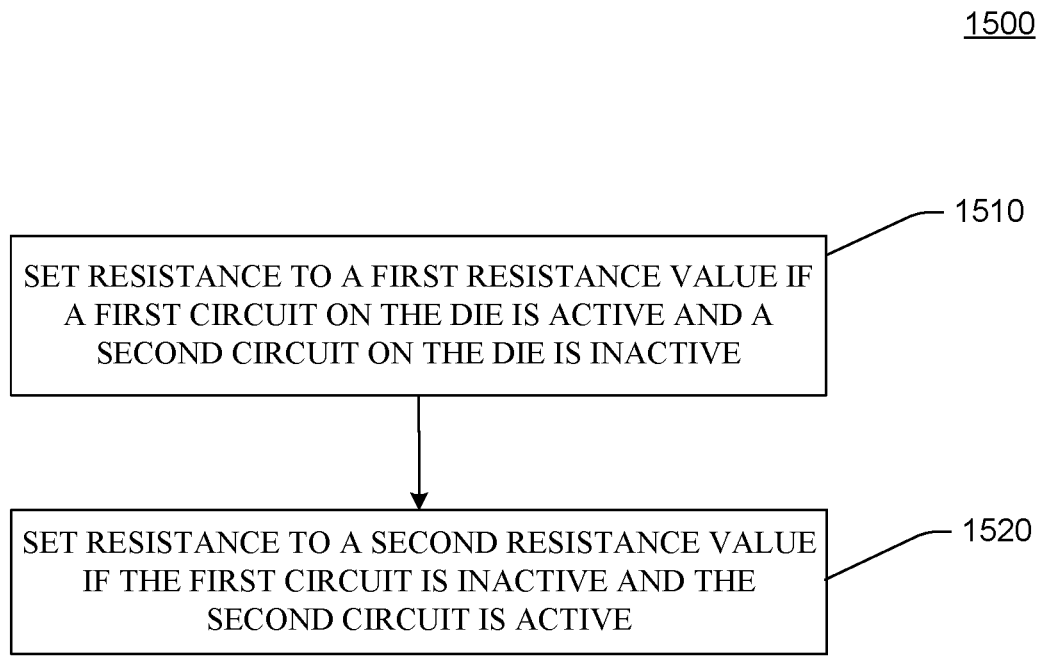
FIG. 15 is a flow diagram illustrating a method for adjusting a resistance on a die according to an embodiment of the present disclosure.

FIG. 15 is a flow diagram illustrating a method 1500 for adjusting a resistance on a die according to an embodiment of the present disclosure. The resistance is between an external power line (e.g., power line 112) and an external capacitor (e.g., package capacitor $C_{pkg}$). The external power line may also refer to one or more conduction paths through the package 617 that couple power from the power supply 110 to the die 620.

In step 1510, the resistance is set to a first resistance value if a first circuit on the die is active and a second circuit on the die is inactive. For example, the resistance may be provided by a resistor switch (e.g., resistor switch 615) coupled between the external power line (e.g., power line 112) and the external capacitor (e.g., package capacitor $C_{pkg}$), and the resistance of the resistor switch may be set to the first resistance value.

In step 1520, the resistance is set to a second resistance value if the first circuit is inactive and the second circuit is active. For example, the resistance may be provided by the resistor switch, and the resistance of the resistor switch may be set to the second resistance value. The method 1500 may optionally include setting the resistance to a third resistance value if both the first and second circuits are active.

As discussed above, the power manager 1325 may disconnect the first circuit 1345a from the power grid when the first circuit 1345a is inactive (e.g., idle) to reduce power leakage. The power manager 1325 does this by turning off the first power-gating switch 1340a. In the inactive state, the die capacitor $Ca_{die}$ of the first circuit 1345a is discharged. When the first circuit 1345a is needed, the power manager 1325 may reconnect the first circuit 1345a to the power grid by turning on the first power-gating switch 1340a. When the first power-gating switch 1340a is first turned on, the first circuit 1345a may consume a large amount of charge from the power grid to charge up the die capacitor $Ca_{die}$. The transfer of charge causes the supply voltage at the power grid to droop. This is because the power supply 110 is not able to supply charge fast enough to the power grid to prevent the droop due to the PDN inductance between the power supply 110 and the die 1320. The voltage droop can potentially cause circuit elements on the die 1320 to malfunction.

The package capacitor $C_{pkg}$ may reduce the voltage droop by supplying some of the charge needed to charge up the die capacitor $Ca_{die}$ of the first circuit 1345a when the first power-gating switch 1340a is first turned on. The package capacitor $C_{pkg}$ supplies charge to the die capacitor $Ca_{die}$ through the resistor switch 615. As a result, the rate at which the package capacitor $C_{pkg}$ is able to transfer charge to the die capacitor $Ca_{die}$, and hence the ability of the package capacitor $C_{pkg}$ to reduce the voltage droop, depends on the resistance of the resistance switch 615.

Figure 16:
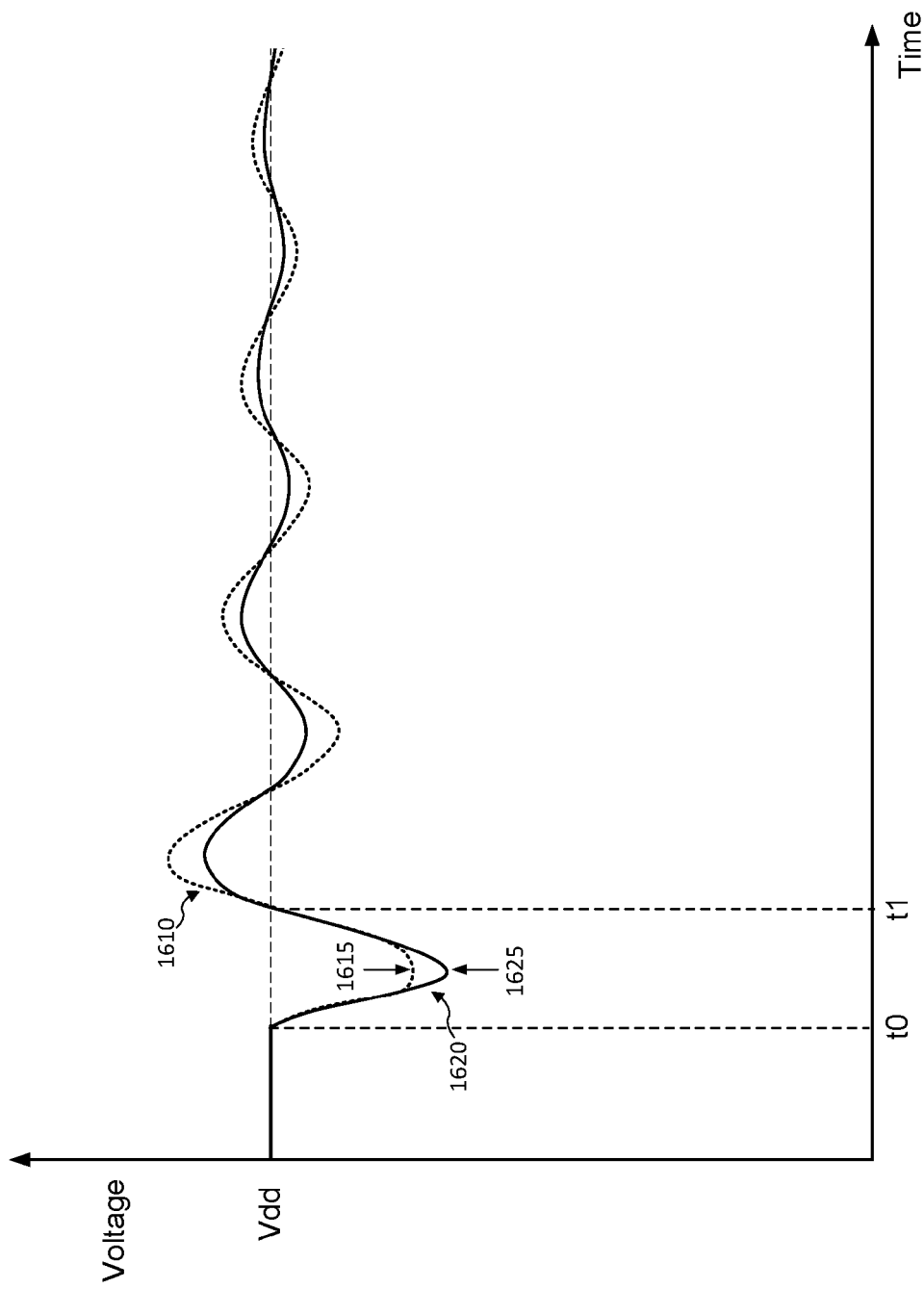
FIG. 16 shows voltage droop for two different switch resistances according to an embodiment of the present disclosure.

In this regard, FIG. 16 shows two voltage curves 1610 and 1620 at the power grid for two different switch resistances, in which voltage curve 1610 corresponds to a lower switch resistance than voltage curve 1620. In FIG. 16, the first power-gating switch 1340a is turned on a time t0. Prior to time t0, the voltage at the power grid is approximately equal to the nominal supply voltage Vdd. When the first power-gating switch 1340a is first turned on, the voltage at the power grid droops due to charge consumption by the die capacitor $Ca_{die}$ of the first circuit 1345a. As shown in FIG. 16, the droop 1615 for voltage curve 1610 is smaller than the droop 1625 for voltage curve 1620. This is because the switch resistance is lower for voltage curve 1610. As a result, the package capacitor $C_{pkg}$ is able to supply charge to the die capacitor $Ca_{die}$ at a faster rate through the resistor switch 615, and therefore reduce the voltage droop by a greater amount.

As also shown in FIG. 16, both voltage curves 1610 and 1620 oscillate at the resonant frequency of the RLC loop 1352a. The oscillations are dampened by the resistance of the resistor switch 615. The higher the switch resistance, the more the oscillations are dampened. As a result, the oscillations die out faster for voltage curve 1620 compared with voltage curve 1610.

Thus, each voltage curve 1610 and 1620 has a desirable property. Voltage curve 1610 has a smaller initial voltage droop than voltage curve 1620, while the oscillations of voltage curve 1620 are dampened out at a faster rate than voltage curve 1610.

In one embodiment, the resistance controller 625 dynamically adjusts the resistance of the resistance switch 615 during power up of the first circuit 1345a to achieve a voltage curve having the desirable properties of both voltage curves 1610 and 1620. More particularly, when the power-gating switch 1340a is first turned on, the resistance controller 625 may set the resistance of the resistance switch 615 to a first resistance value. After the initial voltage droop, the resistance controller 625 may set the resistance of the resistance switch 615 to a second resistance value, in which the second resistance value is greater than the first resistance value. The first resistance value allows the package capacitor $C_{pkg}$ to supply charge to the die capacitor $Ca_{die}$ faster (thereby reducing the initial voltage droop by a larger amount), while the second resistance value (which is greater than the first resistance value) dampens out oscillations at a faster rate.

In one embodiment, the resistance controller 625 may monitor the voltage at the power grid during power up of the first circuit 1345a, and dynamically adjust the resistance of the resistor switch 615 based on the detected voltage. For example, the resistance controller 625 may set the resistance of the switch resistor 615 to the first resistor value when the voltage at the power grid falls below a first voltage threshold, indicating the start of the initial voltage droop. The first voltage threshold may be a voltage that is slightly below the nominal supply voltage Vdd. The resistance controller 625 may then set the resistance of the switch resistor 615 to the second resistor value when the voltage at the power grid rises above a second voltage threshold, indicating that the initial voltage droop has passed. The second voltage threshold may be approximately equal to Vdd. The first and second voltage thresholds may have the same values or different values. In the example shown in FIG. 16, the resistance controller 625 may set the resistance of the resistor switch 615 to the first resistance value during a time period between t0 and t1 to reduce the initial droop.

Figure 17:
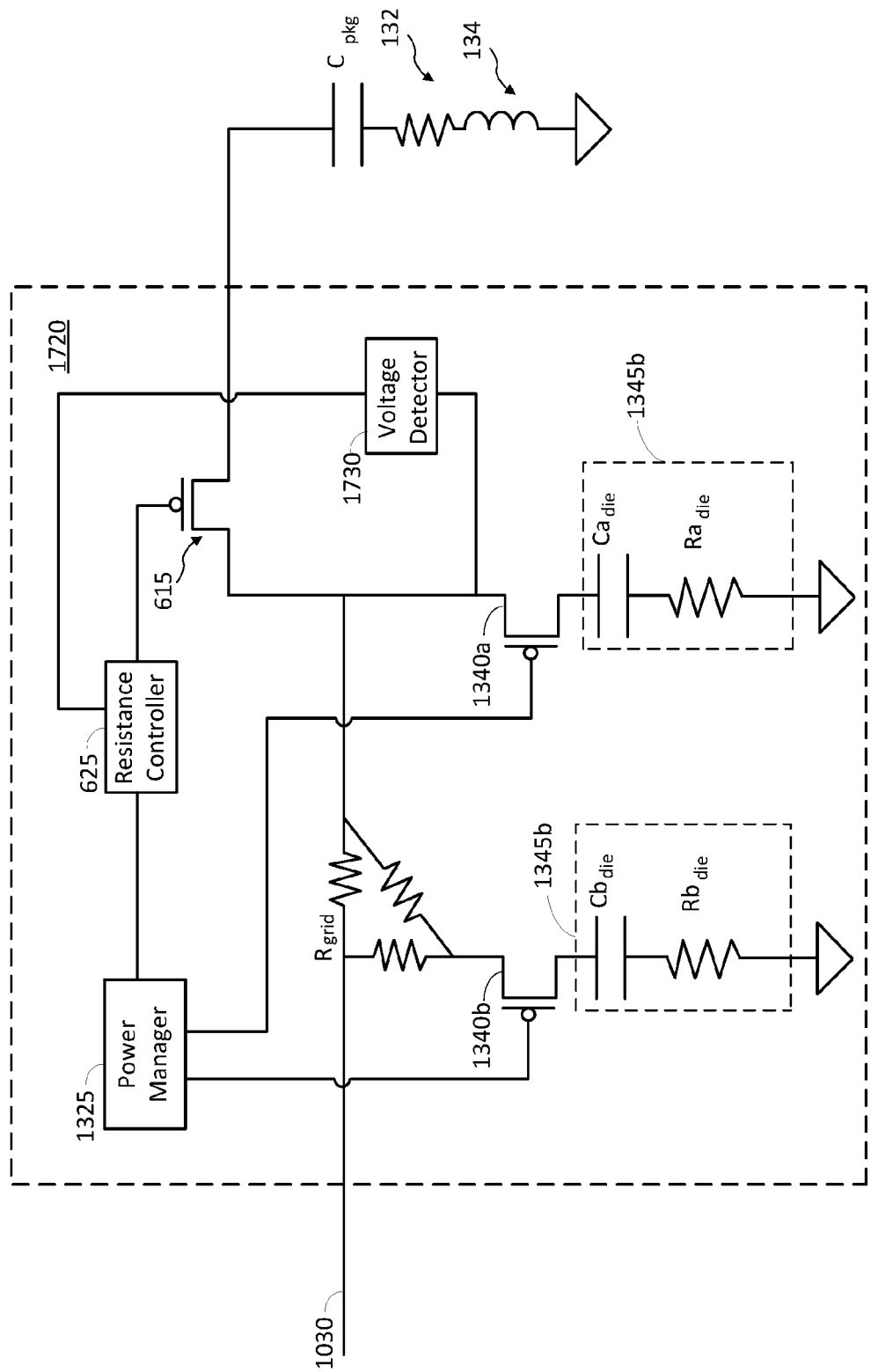
FIG. 17 shows circuitry for dynamically adjusting the resistance of a resistor switch during power up of a circuit according to an embodiment of the present disclosure.

FIG. 17 shows exemplary circuitry for dynamically adjusting the resistance of the resistor switch 615 during power up of the first circuit 1345a according to an embodiment of the present disclosure. In this embodiment, the die 1720 includes a voltage detector 1730 coupled to the power grid. The voltage detector 1730 is configured to measure the voltage at the power grid and to output the measured voltage to the resistance controller 625.

When the first circuit 1345a is to be powered up from an inactive state to an active state, the power manager 1325 may send a signal to the resistance controller 625 indicating that the first circuit 1345a is about to be powered up. In response, the resistance controller 625 may monitor the measured voltage from the voltage detector 1730. When the measured voltage falls below the first voltage threshold, the resistance controller 625 may set the resistance of the resistor switch 615 to the first resistance value. The resistance controller 625 may continue to monitor the measured voltage, and, when the measured voltage rises above the second voltage threshold, the resistance controller 625 may set the resistance of the resistor switch 615 to the second resistance value. After the oscillations have been sufficiently reduced to begin active operation of the first circuit 1345a, the resistance controller 625 may set the resistance of the resistor switch 615 to the resistance value determined above for the active state (e.g., resistance value determined using the method 1200 in FIG. 12).

Alternatively, the resistance controller 625 may set the resistance of the resistor switch 615 to the second resistance value after a predetermined time delay from the time that the resistance of the resistance switch 615 is set to the first resistance value. The time delay may be based on an estimation of the time duration of the initial voltage droop.

Figure 18:
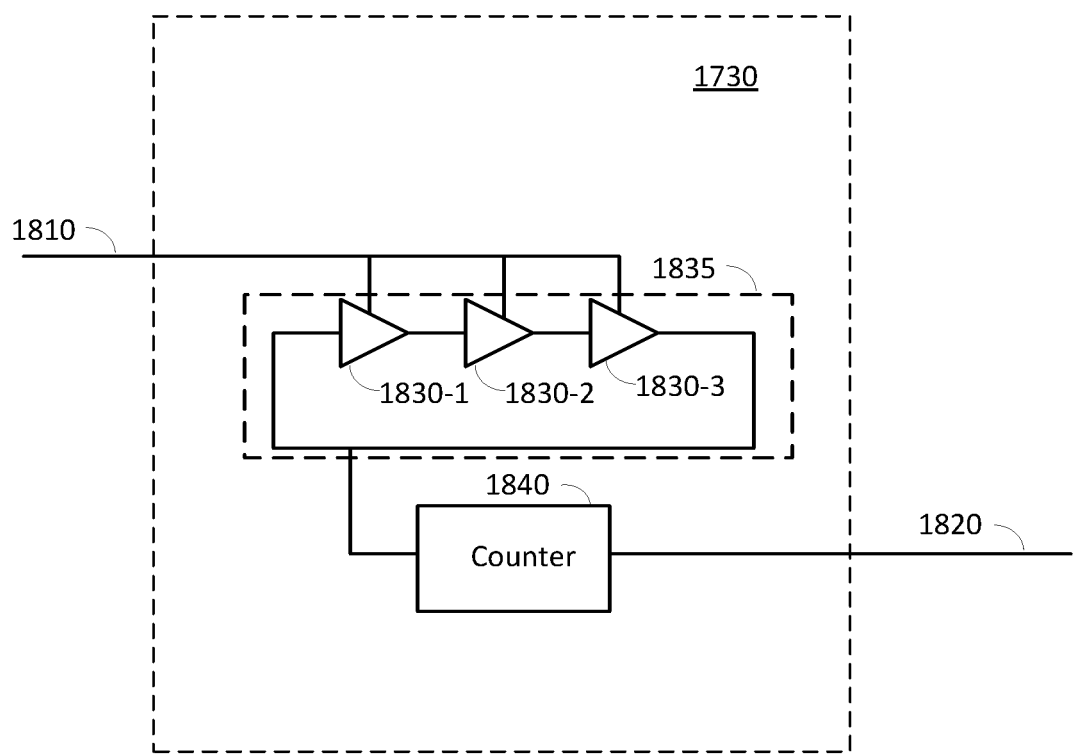
FIG. 18 shows an exemplary implementation of a voltage detector according to an embodiment of the present disclosure.

FIG. 18 shows an exemplary implementation of the voltage detector 1730 according to an embodiment of the present disclosure. In this embodiment, the voltage detector 1730 comprises an odd number of inverters 1830-1 to 1830-3 coupled in series, in which the output of the last inverter 1830-3 is coupled to the input of the first inverter 1830-1. As a result, the inverters 1830-1 to 1830-3 form a ring oscillator 1835, in which the oscillation frequency of the ring oscillator 1835 is a function of the delays of the inverters 1830-1 to 1830-3.

The inverters 1830-1 to 1830-3 are biased by a voltage at the input 1810 of the voltage detector 1730, which is coupled to the power grid. Thus, the inverters 1830-1 to 1830-3 are biased by the voltage at the power grid. The delays of the inverters 1830-1 to 1830-3 are a function of the bias voltage of the inverters 1830-1 to 1830-3, and hence are a function of the voltage at the power grid. Since the oscillation frequency of the ring oscillator 835 is a function of the delays of the inverters 1830-1 to 1830-3, the oscillation frequency of the ring oscillator is a function of the voltage at the power grid, and may therefore be used to measure the voltage at the power grid.

In this regard, the voltage detector 1730 comprises a counter 1840 coupled to the ring oscillator 1835. The counter 1840 is configured to count the number of oscillations of the ring oscillator 1835 over a period of time, and output the count value to the resistance controller 625 at output 1820. The count value is a function of the oscillation frequency of the ring oscillator, and hence a function of the voltage at the power grid. Thus, the count value from the counter 1840 provides a measurement of the voltage at power grid.

It is to be appreciated that the resistance of the resistor switch 615 may also be dynamically adjusted during power up of the second circuit 1345b. For example, the resistance controller 625 may monitor the voltage at the power grid during power up of the second circuit 1345b, and dynamically adjust the resistance of the resistor switch 615 based on the detected voltage in a manner similar to that described above for the first circuit 1345a.

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a capacitor; and
   a die, the die comprising:
      a resistor switch coupled between a power line and the capacitor, wherein the resistor switch has an adjustable resistance, and the power line and the capacitor are both external to the die;
      a circuit configured to receive power from the power line; and
      a controller configured to open the resistor switch if the power line is powered down.

2. The apparatus of claim 1, further comprising a package, wherein the die is mounted on the package and the capacitor is in the package.

3. The apparatus of claim 2, wherein the capacitor comprises a multilayer ceramic capacitor embedded in the package.

4. The apparatus of claim 1, further comprising a package, wherein the die and the capacitor are mounted on the package.

5. The apparatus of claim 1, wherein the die further comprises a power-gating switch coupled between the circuit and the power line, wherein the power-gating switch is configured to power gate the circuit.

6. An apparatus, comprising:
   a capacitor; and
   a die, the die comprising:
      a resistor switch coupled between a power line and the capacitor, wherein the resistor switch has an adjustable resistance, and the power line and the capacitor are both external to the die;
      a circuit configured to receive power from the power line; and
      a resistor controller configured to dynamically adjust the resistance of the resistor switch during power up of the circuit from an inactive state to an active state.

7. The apparatus of claim 6, wherein the die further comprises a voltage detector configured to detect a voltage on a power grid of the die, and wherein, during power up of the circuit, the resistor controller is configured to set the resistance of the resistor switch to a first resistance when the detected voltage falls below a first voltage threshold, and to set the resistance of the resistor switch to a second resistance value when the detected voltages rises above a second voltage threshold.

8. The apparatus of claim 6, further comprising a package, wherein the die is mounted on the package and the capacitor is in the package.

9. The apparatus of claim 8, wherein the capacitor comprises a multilayer ceramic capacitor embedded in the package.

10. The apparatus of claim 6, further comprising a package, wherein the die and the capacitor are mounted on the package.

11. The apparatus of claim 6, wherein the die further comprises a power-gating switch coupled between the circuit and the power line, wherein the power-gating switch is configured to power gate the circuit.

* * * * *